(12) United States Patent
Nishio et al.

(10) Patent No.: US 7,261,953 B2
(45) Date of Patent: Aug. 28, 2007

(54) ORGANIC ELECTROLUMINESCENT DEVICE

(75) Inventors: Ryo Nishio, Kanagawa (JP); Naoyuki Nishikawa, Kanagawa (JP); Shinsuke Umegaki, Kanagawa (JP)

(73) Assignee: FujiFilm Corporation, Tokyo (JP)

( * ) Notice: Subject to any disclaimer, the term of this patent is extended or adjusted under 35 U.S.C. 154(b) by 355 days.

(21) Appl. No.: 10/912,115

(22) Filed: Aug. 6, 2004

(65) Prior Publication Data
US 2005/0037235 A1 Feb. 17, 2005

(30) Foreign Application Priority Data
Aug. 11, 2003 (JP) ............... 2003-207082

(51) Int. Cl.
 *H05B 33/12* (2006.01)
 *H01L 51/54* (2006.01)
 *C09K 11/06* (2006.01)

(52) U.S. Cl. ............ 428/690; 428/917; 313/504; 313/506

(58) Field of Classification Search ............ 313/504, 313/506; 428/690, 917; 257/40, 102, 103
See application file for complete search history.

(56) References Cited

U.S. PATENT DOCUMENTS 6,908,638 B2 * 6/2005 Ueda et al. ............ 427/66

FOREIGN PATENT DOCUMENTS

EP 1394158 * 3/2004
JP A 2002-170685 6/2002

OTHER PUBLICATIONS

Hiroaki Tokuhisa et al., "Polarized electroluminescence from smectic mesophase" Appl. Phys. Lett., vol. 72, No. 21, May 25, 1998 2639.
Kyoko Koga et al., "Polarized light emission from a calamitic liquid crystallin semi-conductor doped withe dyes" Appl. Phys. Lett., vol. 73, No. 11, Sep. 14, 1998 1595.
Hiroyuki Mochizuki et al., "Emission behavior of molecularly doped electroluminescent device using liquid-crystalline matrix" Appl. Phys. Lett., vol. 77, No. 11, Sep. 11, 2000 1587.

* cited by examiner

*Primary Examiner*—Rena Dye
*Assistant Examiner*—Camie S. Thompson
(74) *Attorney, Agent, or Firm*—Margaret A. Burke; Sheldon J. Moss

(57) ABSTRACT

An organic electroluminescent device including a pair of electrodes and a layer that is disposed between the pair of electrodes and includes a compound represented by the following formula (1):

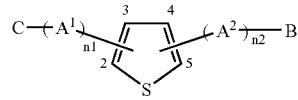

wherein each of $A^1$, $A^2$, B, C, n1 and n2 is given the definition as set forth in the specification and claims.

18 Claims, 2 Drawing Sheets

ORGANIC ELECTROLUMINESCENT DEVICE

CROSS-REFERENCE TO RELATED APPLICATION

This application claims priority under 35USC 119 from Japanese Patent Application No. 2003-207082, the disclosure of which is incorporated by reference herein.

BACKGROUND OF THE INVENTION

1. Field of the Invention

The present invention relates to an organic electroluminescent device and specifically to an organic electroluminescent device that can be designed to have a simple device structure.

2. Description of the Related Art

In recent years, investigations have been made regarding a light-emitting device using a liquid crystal compound. Among such light-emitting devices, a device that can achieve high-speed response or high luminance at a low driving voltage is particularly desired. For example, Japanese Patent Application Laid-Open (JP-A) No. 2002-170685 discloses a technique of utilizing orientation characteristics of a liquid crystal compound, in which the state of the liquid crystal orientation is controlled by temperature and voltage so that the luminance of emitted light can be controlled. In such a technique, however, the liquid crystal layer needs to contain plural components including a carrier-transporting material and a luminescent material; therefore the device structure can be complicated.

Appl. Phys. Lett., Vol. 73, No. 11, 14 Sep. 1998, pp. 1595-1597 discloses a liquid crystal cell including a layer (monolayer) in which a host liquid crystal compound is doped with a fluorescent dye, wherein the host liquid crystal compound is used as a charge-transporting material. However, such a device has a complicated structure, because the fluorescent dye has no liquid-crystallinity and the host liquid crystal compound is used as the charge-transporting material. Appl. Phys. Lett., Vol. 77, No. 11, 11 Sep. 2000, pp. 1587-1589 discloses an organic light-emitting device which uses a mixture of a liquid crystal compound with a fluorescent dye in order to emit light. However, this device also has a complicated structure. Further, Appl. Phys. Lett., Vol. 72, No. 21, 25 May, 1998, pp. 2639-2641 discloses an example of a light-emitting device having a three-layer structure. However, since the device has the three-layer structure, the structure of this device is also complicated.

SUMMARY OF THE INVENTION

The present invention has been made in view of the above-described circumstances and provides an organic electroluminescent device that can be designed to have a simple structure and can offer high luminance at low driving voltage.

An aspect of the invention is to provide an organic electroluminescent device including: a pair of electrodes; and a layer that is disposed between the pair of electrodes and contains a compound represented by the following formula (1):

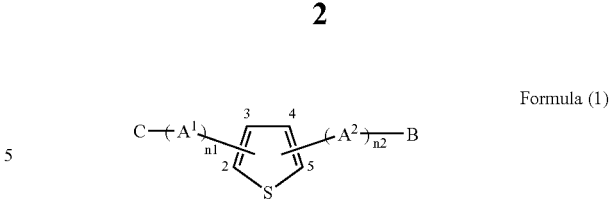

Formula (1)

In formula (1), $A^1$ and $A^2$ each independently represent an aromatic ring and may be substituents any of positions 2, 3, 4 and 5 of the thiophene ring; B represents a substituent having a positive Hammett substituent constant $\sigma p$; C represents a substituent having a negative Hammett substituent constant $\sigma p$; n1 and n2 each independently represent an integer of 0, 1 or 2, wherein n1 and n2 are not 0 at the same time; and the thiophene ring may have a substituent selected from the group consisting of an alkyl group having 1 to 8 carbon atoms, an alkoxy group and a halogen atom.

DETAILED DESCRIPTION OF THE INVENTION

Figure 1:
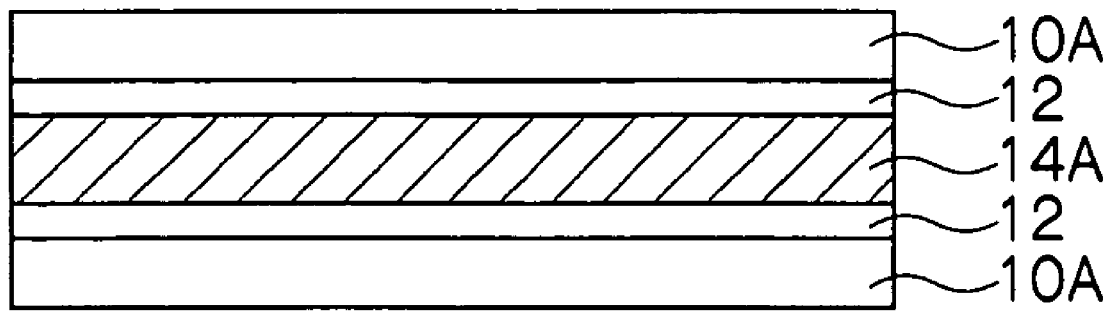
FIG. 1 is a schematic cross-sectional diagram showing the structure of a light-emitting device according to a first embodiment of the present invention.

A detailed description is provided below of the present inventive organic electroluminescent device (also referred to as the inventive device or the inventive light-emitting device).

An aspect of the invention is to provide an organic electroluminescent device including a pair of electrodes and a layer that is disposed between the pair of electrodes and contains the compound represented by the following formula (1):

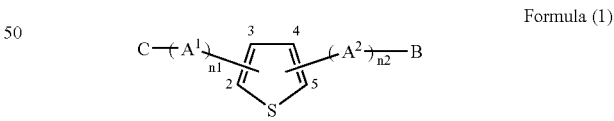

Formula (1)

In formula (1), $A^1$ and $A^2$ each independently represent an aromatic ring and may be substituents at any of positions 2, 3, 4 and 5 of the thiophene ring; B represents a substituent having a positive Hammett substituent constant $\sigma p$; C represents a substituent having a negative Hammett substituent constant $\sigma p$; n 1 and n2 each independently represent an integer of 0, 1 or 2, wherein n1 and n2 are not 0 at the same time; and the thiophene ring may have a substituent selected from the group consisting of an alkyl group having 1 to 8 carbon atoms, an alkoxy group and a halogen atom.

The compound represented by formula (1) may be a compound represented by the following formula (2):

Formula (2)

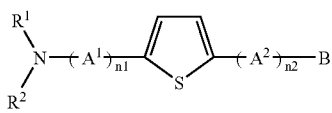

In formula (2), $A^1$ and $A^2$ each independently represent an aromatic ring; B represents a substituent having a positive Hammett substituent constant σp; $R^1$ and $R^2$ each independently represent an alkyl group; n1 and n2 each independently represent an integer of 0, 1 or 2, wherein n1 and n2 are not 0 at the same time; and the thiophene ring may have a substituent selected from the group consisting of an alkyl group having 1 to 8 carbon atoms, an alkoxy group and a halogen atom.

$A^1$ and $A^2$ each independently represent an aromatic ring, and either one of $A^1$ and $A^2$ is preferably an aromatic ring having 5 to 10 carbon atoms. Preferred examples of such an aromatic ring include 1,4-phenylene, thiophene-2,5-diyl, 2,6-naphthalene, thiazole-2,5-diyl, pyridine-2,3-diyl, benzofuran-2,5-diyl, benzofuran-2,6-diyl, benzothiophene-2,5-diyl, benzothiophene-2,6-diyl, pyrimidine-2,5-diyl, pyrazine-2,5-diyl and pyridazine-3,6-diyl. More preferred are 1,4-phenylene, 2,6-naphthalene and thiophene-2,5-diyl. Either one of $A^1$ and $A^2$ is more preferably 2,6-naphthalene. In a particularly preferred manner, $A^1$ is 1,4-phenylene and $A^2$ is 2,6-naphthalene; or $A^1$ is 2,6-naphthalene and $A^2$ is 1,4-phenylene. $A^1$ and $A^2$ may have a substituent. Preferred examples of such a substituent include an alkyl group having 1 to 8 carbon atoms, an alkoxy group and a halogen atom. More preferred is an alkyl group having 1 to 4 carbon atoms (such as methyl, ethyl, n-propyl, isopropyl, n-butyl, isobutyl, sec-butyl, and tert-butyl).

$A^1$ and $A^2$ may be substituents at any of positions 2, 3, 4 and 5 of the thiophene ring. In formula (1), $A^1$ is preferably a substituent at position 2 or 5 of the thiophene ring, and $A^2$ is preferably a substituent at position 5 or 2 of the thiophene ring. More preferably, the compound represented by formula (1) is represented by formula (2).

In Formula (1), C represents a substituent having a negative Hammett substituent constant σp. Specifically, C represents an electron-donating group such as a substituted amino group and an alkoxy group. A straight-chain alkyl-substituted amino group is particularly preferred as such a group.

In formulae (1) and (2), B represents a substituent having a positive Hammett substituent constant σp. Specifically, B preferably represents an ester group (—$COOR^3$), a sulfonyl group (—$SO_2R^3$), a sulfoxy group (—$SO_3R^3$), or any of the substituents shown below, and more preferably represents the ester group, wherein $R^3$ represents an alkyl group having 1 to 16 carbon atoms, and preferably a straight-chain alkyl group having 1 to 12 carbon atoms.

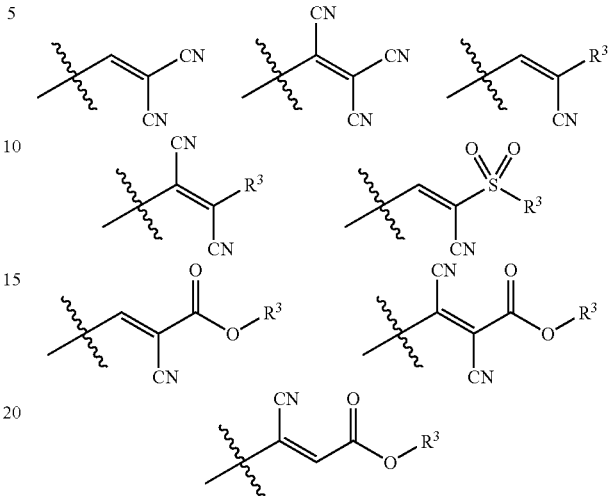

A description is provided below of the Hammett substituent constant σp. Hammett's rule is an empirical rule that was proposed by L. P. Hammett in 1935 for the purpose of quantitatively discussing the effect of substituents on the reaction or equilibrium of benzene derivatives. The substituent constants obtained according to Hammett's rule include σp and σm values. These values are shown in many general textbooks. For example, the text "Lange's Handbook of Chemistry," the 12th edition, edited by J. A. Dean, 1979 (McGraw-Hill) or "Kagaku no Ryoiki" (Journal of Japanese Chemistry), an extra issue, 122, 96-103, 1979 (Nankodo), the disclosures of which are incorporated herein by reference, may be used in the invention.

In formula (2), $R^1$ and $R^2$ each independently represent an alkyl group, preferably a straight-chain alkyl group, and more preferably a straight-chain alkyl group having 1 to 6 carbon atoms (such as methyl, ethyl and propyl).

In the invention, the thiophene ring group in formulae (1) and (2) may also have a substituent, which may preferably be an alkyl group having 1 to 8 carbon atoms, an alkoxy group or a halogen atom, particularly preferably an alkyl group having 1 to 4 carbon atoms (such as methyl, ethyl, n-propyl, isopropyl, n-butyl, isobutyl, sec-butyl, and tert-butyl).

Preferred examples of the liquid crystal compound represented by formula (1) or (2) are shown as follows:

Compound 1

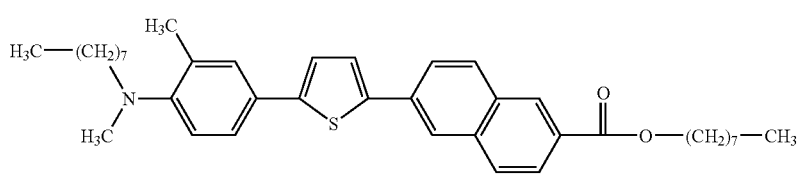

-continued

Compound 2

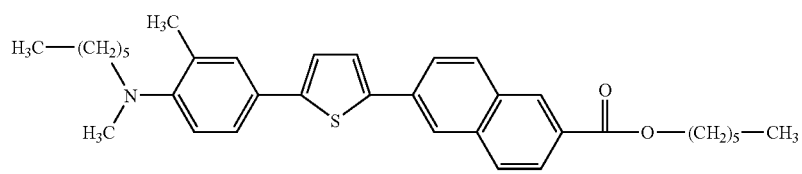

Compound 3

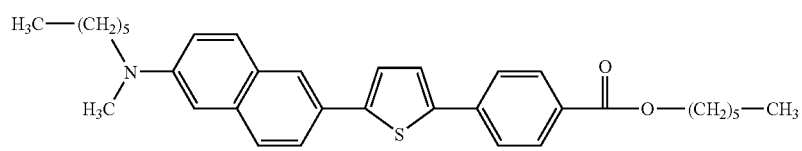

Compound 4

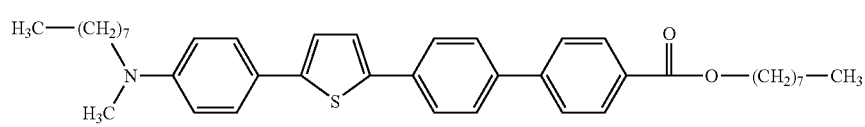

Compound 5

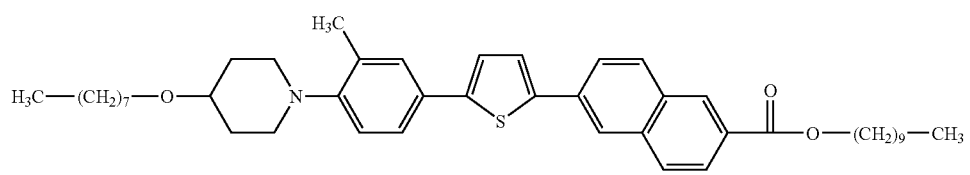

Compound 6

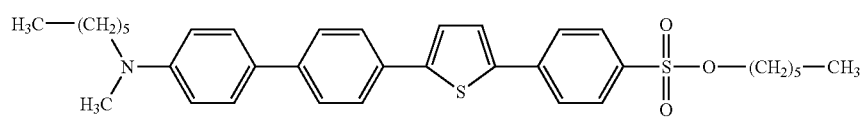

Compound 7

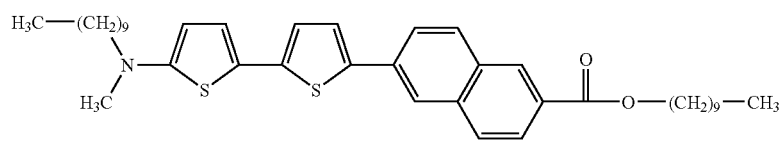

The compound according to the invention may be synthesized by any known method including, but not limited to, the synthesis method disclosed in European Patent Application Publication No. 1 394 158 A1, the disclosure of which is incorporated by reference.

The inventive light-emitting device includes a pair of electrodes (positive and negative electrodes) (preferably a pair of electrodes, at least one of which is a transparent electrode) and a layer that is disposed between the pair of electrodes and contains the compound represented by formula (1) or (2). The device having a light-emitting layer may also have any other layer such as a hole-injecting layer, a hole-transporting layer, an electron-injecting layer, an electron-transporting layer, and a protective layer. Each of such layers may also have any other function. Each layer may be produced with any of various materials. In a preferred mode, the compound according to the invention is contained as a main component of the layer and has the function of emitting light by itself (the function of forming a light-emitting layer).

The layer that contains at least one compound represented by formula (1) or (2) according to the invention may also contain any additive or the like for appropriately optimizing light emission. The layer may contain the compound according to the invention at any concentration and preferably contains it as a main component. A mixture with the compound according to the invention may be used in the inventive device. In such a case, the compound or the liquid crystal compound is preferably used in combination with a polymer medium, a spacer such as a particulate material/a sealing agent, an orientation-controlling agent, or any other liquid-crystalline compound (such as 4-cyano-4'-pentylbiphenyl).

In terms of optimizing the emission performance and/or simplifying the device structure, the compound according to the invention preferably exhibits liquid crystallinity, more preferably exhibits a smectic or nematic phase, and particularly preferably exhibits a smectic phase. The liquid crystal compound that exhibits the smectic phase can emit light of higher luminance as compared with the nematic phase or any other liquid crystal phase, and thus is useful for a liquid crystal light-emitting device.

The layer that contains the compound represented by formula (1) or (2) may also contain any other material such as a binder of a polymer medium and a spacer of a particulate material or a sealing agent, as needed. Examples of the polymer medium include acrylic polymers such as PMMA, imide polymers such as fluorinated polyimide, and polycarbonate. Examples of the particulate material include glass beads, plastic beads and alumina beads, and cross-linked cured transparent resins that are insoluble in a solvent or the like for use in preparation of a coating liquid for the light-emitting layer. The sealing agent may include an epoxy resin, a curing agent, a thickener, and the like, and can cause a reaction and curing when the curing agent dispersed in the sealing agent is dissolved.

The material for the hole-injecting layer or the hole-transporting layer should only have any one of the function of injecting holes from the positive electrode, the function of transporting holes and the function of blocking electrons injected from the negative electrode. Examples of such a material include carbazole, imidazole, triazole, oxazole, oxadiazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine, aromatic dimethylidine compounds, porphyrin compounds, polysilane compounds, poly(N-vinylcarbazole), aniline copolymers, thiophene oligomers or polymers, electrically conductive macromolecular oligomers or polymers such as polythiophene, carbon films, and derivatives of any of the above. The thickness of the hole-injecting or transporting layer is not limited by the material and is preferably from 1 nm to 5 µm, more preferably from 5 nm to 1 µm, and still more preferably from 10 nm to 500 nm. The hole-injecting or transporting layer may have a monolayer structure including one or more of the above materials or a multilayer structure including plural layers which are the same or different in composition. The hole-injecting or transporting layer may be formed by vacuum deposition, LB method, ink jetting, printing, transfer method, or coating (such as spin coating, casting or dip coating) with a solution or dispersion of a hole-injecting or transporting material in a solvent. In the coating method, the material may be dissolved or dispersed together with a resin component. Examples of such a resin component include polyvinyl chloride, polycarbonate, polystyrene, poly(methyl methacrylate), polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

The material for the electron-injecting or transporting layer should only have any one of the function of injecting electrons from the negative electrode, the function of transporting electrons and the function of blocking holes which would otherwise be injected from the positive electrode. Examples of such a material include a variety of metal complexes such as metal complexes of triazole, triazine, oxazole, oxadiazole, fluorenone, anthraquinodimethane, anthrone, diphenylquinone, thiopyran dioxide, carbodiimide, fluorenylidenemethane, distyrylpyrazine, an aromatic ring (such as naphthalene or perylene) tetracarboxylic anhydride, phthalocyanine, or an 8-quinolinol derivative; and metal complexes having methallophthalocyanine, benzoxazole or benzothiazole as a ligand. The electron-injecting or transporting layer may have any thickness but generally preferably has a thickness of 1 nm to 5 µm, more preferably of 5 nm to 1 µm, and still more preferably of 10 nm to 500 nm. The electron-injecting or transporting layer may have a monolayer structure including one or more of the above materials or a multilayer structure including plural layers which are the same or different in composition. The electron-injecting or transporting layer may be formed by vacuum deposition, LB method, ink jetting, printing, transfer method, or coating (such as spin coating, casting or dip coating) with a solution or dispersion of an electron-injecting or transporting material in a solvent. In the coating method, the material may be dissolved or dispersed together with a resin component. Examples of such a resin component include the same materials exemplified for the hole-injecting or transporting layer in the above.

The negative electrode supplies electrons to the electron-injecting layer, the electron-transporting layer, the light-emitting layer, or the like. The negative electrode should be selected in view of adhesion to the adjacent layer such as the electron-injecting layer, the electron-transporting layer and the light-emitting layer, ionization potential, stability, or the like. The material for the negative electrode may be a metal, an alloy, a metal oxide, an electrically conductive compound, or any mixture thereof. Specific examples of such a material include alkali metals (such as Li, Na, K, and Cs) or fluorides or oxides thereof; alkaline earth metals (such as Mg and Ca) or fluorides or oxides thereof; gold, silver, lead, aluminum; a sodium-potassium alloy or mixture; a lithium-aluminum alloy or mixture; a magnesium-silver alloy or mixture; indium; and rare earth metals such as ytterbium. Preferred are materials having a work function of 4 eV or less. More preferred are aluminum, a lithium-aluminum alloy or mixture and a magnesium-silver alloy or mixture. The thickness of the negative electrode may appropriately be selected depending on the material, and is generally preferably from 10 nm to 5 µm, more preferably from 50 nm to 1 µm, and still more preferably from 100 nm to 1 µm. The negative electrode may be formed by electron beam deposition, sputtering, resistance heating vacuum deposition, coating, or the like. A single metal may be vapor-deposited, or two or more components may be vapor-deposited at the same time. Different metals may be vapor-deposited at the same time to form an alloy electrode. Alternatively, a previously prepared alloy may be vapor-deposited. The sheet resistance of the positive or negative electrode is preferably as low as possible, for example, preferably at most several hundreds ohms per square.

The positive electrode supplies holes to the hole-injecting layer, the hole-transporting layer, the light-emitting layer, or the like. The positive electrode may be made of a metal, an alloy, a metal oxide, an electrically conductive compound, or any mixture thereof, and preferably made of a material having a work function of 4 eV or more. Examples of such a material include electrically conductive metal oxides such as tin oxide, zinc oxide, indium oxide, and indium tin oxide (ITO); metals such as gold, silver, chromium, and nickel; any mixture or laminate of the metal(s) and the conductive metal oxide(s); inorganic conductive substances such as copper iodide and copper sulfide; organic conductive materials such as polyaniline, polythiophene and polypyrrole; and a laminate of any of the above materials and ITO. The electrically conductive metal oxide is preferred, and ITO is particularly preferred in terms of productivity, high conductivity, transparency, and the like. The thickness of the positive electrode may appropriately be selected depending on the material and is generally preferably from 10 nm to 5 µm, more particularly from 50 nm to 1 µm, and still more preferably from 100 nm to 500 nm.

The positive electrode is usually a layer formed on a soda-lime glass substrate, an alkali-free glass substrate, a transparent resin substrate, or the like. Of the glass materials, the alkali-free glass is preferably used in terms of less ion elution from the glass. The soda-lime glass is preferably used when it has a barrier coating such as a silica coating. The substrate may have any thickness that is enough to keep the mechanical strength. For example, the thickness of the glass substrate is preferably 0.2 mm or more, and more preferably 0.7 mm or more.

The positive electrode may be formed by any of various methods depending on the material. For example, an ITO film electrode may be formed by electron beam deposition, sputtering, resistance heating vacuum deposition, chemical reaction (such as a sol-gel process), or coating with a dispersion of indium tin oxide.

The positive electrode may be subjected to cleaning or any other treatment so that the driving voltage for the device can be reduced or that luminous efficiency can be increased. For example, an UV-ozone treatment or a plasma treatment is effective for the ITO electrode.

The organic electroluminescent device may also have a heater that heats the device up to a temperature at which a liquid crystal compound of the device exhibits a liquid crystal phase. Examples of the heater include those utilizing Joule heat by electric current, those utilizing laser beam heating, and those utilizing Peltier effect. Specific examples of the heater include electric heaters, Peltier device, heat exchangers and the like.

Examples of the device using the compound-containing light-emitting layer according to the invention are described below with reference to the drawings. FIG. 1 is a sectional diagram schematically showing the structure of a device according to an embodiment of the invention. In FIG. 1, reference numeral 10A represents a glass, 12 a transparent electrode, and 14A a light-emitting layer. The light-emitting layer 14A has a cell in which the compound according to the invention is injected. Preferably, the transparent electrode 12 is an ITO electrode, which is formed on the substrate 10A by vapor deposition. In a most preferred mode, the substrate 10A is made of glass, and the transparent electrode 12 is an ITO electrode.

Figure 2:
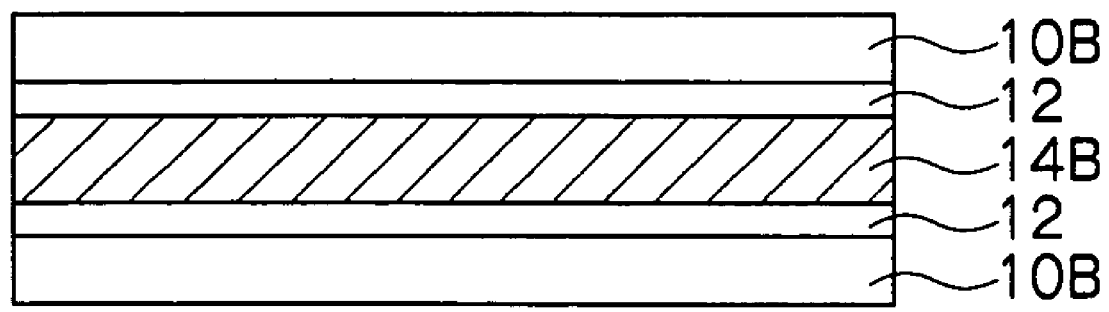
FIG. 2 is a schematic cross-sectional diagram showing the structure of a light-emitting device according to a second embodiment of the invention.

FIG. 2 is a sectional diagram schematically showing the structure of a device according to another embodiment of the invention. In FIG. 2, reference numeral 10B represents a flexible substrate, 12 a transparent electrode, and 14B a light-emitting layer. The flexible substrate 10B is preferably a polymer film or the like. Specifically, the flexible substrate 10B may be a plastic film made of triacetyl cellulose having good transparency and good flatness, polyester such as poly(butylene terephthalate), an epoxy resin, a phenolic resin, polyimide, polycarbonate, polysulfone, polyethersulfone, polyetherimide, poly(amino acid ester), a heat-resisting resin such as aromatic polyamide, polystyrene, polyacrylate, polymethacrylate, polyacrylamide, a vinyl polymer such as polyethylene and polypropylene, a fluororesin such as polyvinylidene fluoride, or a modification of any of the above. In particular, a triacetyl cellulose film is preferably used, because it has good transparency and is optically free from anisotropy. In general, the film preferably has a thickness of 5 to 1000 µm. The light-emitting layer 14B contains the liquid crystal compound and the polymer medium and optionally glass beads or the like for serving as a spacer. The electrode 12 is the same as that in the case of FIG. 1.

Figure 3:
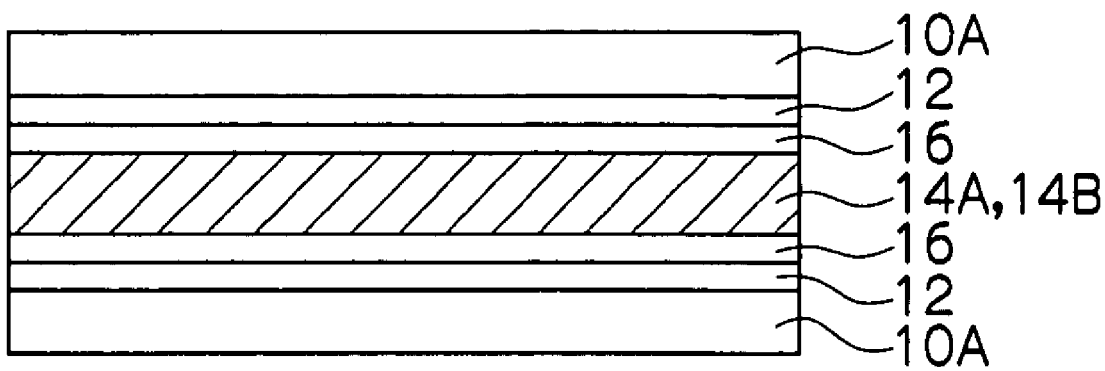
FIG. 3 is a schematic cross-sectional diagram showing the structure of a light-emitting device according to a third embodiment of the invention.

FIG. 3 is a sectional diagram schematically showing the structure of a device according to yet another embodiment of the invention. In FIG. 3, reference numeral 10A represents a glass, 12 a transparent electrode, 14A a light-emitting layer, and 16 a vertical orientation layer. The transparent electrode 12 and the light-emitting layer 14A are the same as those in the case of FIG. 1.

Figure 4:
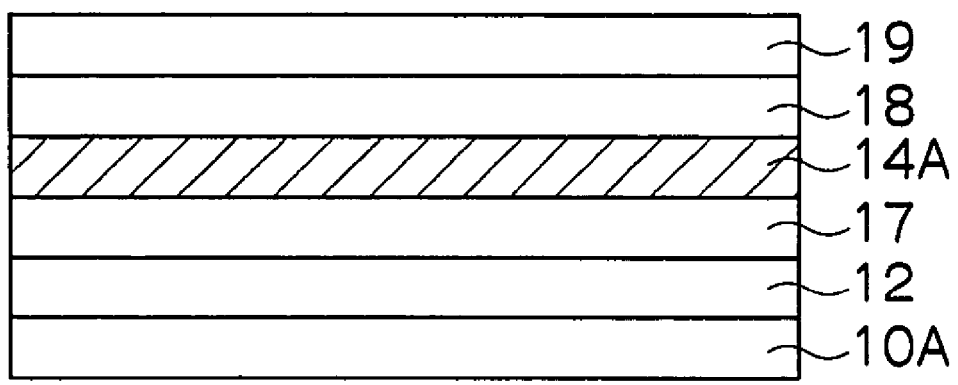
FIG. 4 is a schematic cross-sectional diagram showing the structure of a light-emitting device according to a fourth embodiment of the invention.

FIG. 4 is a sectional diagram schematically showing the structure of a device according to still another embodiment of the invention. In FIG. 4, reference numeral 10A represents a glass, 12 a transparent electrode, 17 a hole-transporting layer, 14A a light-emitting layer, 18 an electron-transporting layer, and 19 a metal electrode.

In each of the above devices, for example, the compound represented by formula (1) having liquid crystallinity is used in the light-emitting layer. In the case of such a device, an external electric field is preferably applied in a temperature range in which the compound exhibits a liquid crystal phase. As another method, the compound is preferably heated under an external electric field up to a temperature at which the compound exhibits an isotropic phase and then cooled to a temperature in which the compound exhibits a liquid crystal phase. Particularly preferably, the external electric field is applied in a temperature range in which the compound exhibits a liquid crystal phase. There is no need to add a fluorescent dye or the like to the light-emitting layer. The device can have such a simple structure, and can provide high luminance at low driving voltage.

EXAMPLES

The present invention is more specifically described by means of the examples recited below. However, the examples should not be construed to limit the scope of the invention.

Example 1

A device having a structure shown in FIG. 1 was prepared. Compound 1 shown below was injected into a cell (a transparent electrode cell manufactured by EHC Co., Ltd.) including a pair of 1.1 mm-thick glass plates which were each provided with an ITO electrode (with a thickness of 30 nm and a resistance value of 200 Ω per square) and opposed and bonded to each other with a 5 µm gap provided therebetween. After the substrates were heated at isotropic phase temporarily, they were cooled at 67° C., while a DC voltage of 100 V was applied between the ITO electrodes. As a result, the device continued to emit light for at least 10 hours at a luminance of at least 10 cd/m³.

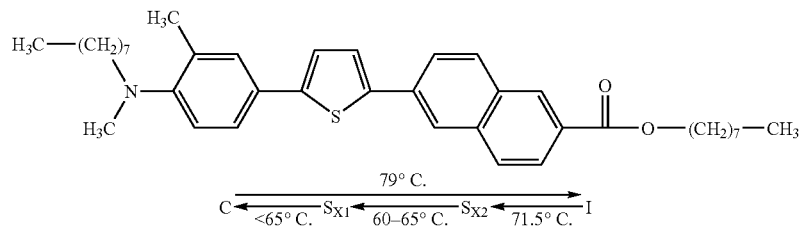

Compound 1

Compound 1 exhibits monotropic liquid crystallinity. C represents a solid state, $S_{X1}$ and $S_{X2}$ represent a smectic phase, and I represents an isotropic phase.

Example 2

A device having a structure shown in FIG. 1 was prepared. Compound 2 shown below was injected into a cell (a transparent electrode cell manufactured by EHC Co., Ltd.) including a pair of 1.1 mm-thick glass plates which were each provided with an ITO electrode (with a thickness of 30 nm and a resistance value of 200 Ω per square) and opposed and bonded to each other with a 5 μm gap provided therebetween. Compound 2 exhibits a smectic C phase at 71° C. with increasing temperature. The substrates were heated at 75° C., while a DC voltage of 100 V was applied between the ITO electrodes. As a result, the device continued to emit light for at least 10 hours at a luminance of at least 20 cd/m³.

Compound 2

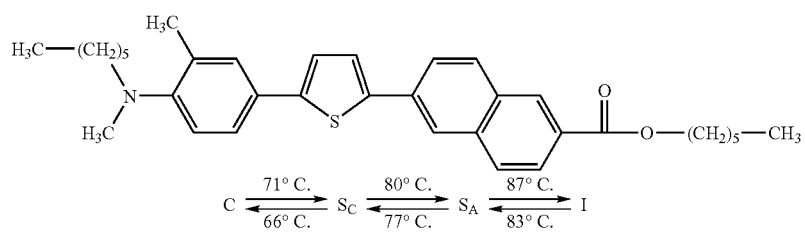

Compound 2 exhibits enantiotropic liquid crystallinity. C represents a solid state, $S_C$ represents a smectic C phase, $S_A$ represents a smectic A phase, and I represents an isotropic phase.

Example 3

A device having a structure shown in FIG. 3 was prepared. Compound 2 was injected into a cell (a transparent electrode cell manufactured by EHC Co., Ltd.) including a pair of 1.1 mm-thick glass plates which were each provided with a 150 μm-thick vertical orientation film and a 30 nm-thick ITO electrode and opposed and bonded to each other with a 5 μm gap provided therebetween. A DC voltage of 100 V was applied between the ITO electrodes. As a result, the luminance of the device was three times as high as that of Example 1 (60 cd/m³), and the device continued to emit light for at least 10 hours at such a luminance.

Example 4

Example 4 was performed in the same manner as in Example 2 except that temperature of the light-emitting layer was altered. The device did not emit light in a solid state (60° C.) and an isotropic phase (90° C.), while the device emitted light in a liquid crystal state, selectively.

Example 5

A device having a structure shown in FIG. 2 was prepared. An ITO electrode layer was formed by vapor deposition on a 200 μm-thick flexible transparent plastic sheet of TAC (triacetyl cellulose) to form a substrate. A liquid crystal composition containing 100 parts by mass of Compound 1 and 10 parts by mass of glass beads with a diameter of 5 μm was then applied to the electrode layer of the substrate. Another 200 μm-thick flexible transparent plastic sheet of TAC (triacetyl cellulose) having an ITO electrode layer formed by vapor deposition was then bonded to the substrate in such a manner that the ITO electrode layer surface was brought into contact with the coating surface, so that the device was formed. In the device, the gap between the ITO electrode layers was almost the same as the diameter of the glass beads (5 μm). A DC voltage of 50 V was applied between the ITO electrodes. As a result, the device continued to emit light. Even when bent slightly, the entirely flexible device stably emitted light.

Example 6

A device having a structure shown in FIG. 4 was prepared by a process including the steps of: vapor-depositing a 40 nm-thick TPD (N,N'-diphenyl-N,N'-di(m-tolyl)-benzidine layer, a 30 nm-thick Compound 2 layer, a 30 nm-thick Alq (tris(8-hydroxyquinolinato)aluminum) layer, and a 5 nm-thick lithium fluoride layer, respectively, on a 1.1 mm-thick glass plate having a 30 nm-thick ITO electrode; and then vapor-depositing a 500 nm-thick aluminum layer. A DC voltage of 11 V was applied between the ITO electrode and the aluminum electrode. As a result, the device emitted light at 1666 cd/m² (wherein the current density was 159 mA/cm², and the external luminous efficiency was 0.3%).

As described above, the device according to the invention does not need to have plural specifically-structured organic compound layers and can emit light using a simple structure. There is no need to add a fluorescent dye or the like to the light-emitting layer in such a simple device, and thus the light-emitting layer does not need to be sealed from air contact. Because of this feature, the device structure can also be made simple. If both electrodes are a transparent electrode such as an ITO electrode, the electrodes may not be distinguished from each other for operation and thus can be highly convenient. In such a case, emitted light can also be taken from both front and rear sides.

What is claimed is:
1. An organic electroluminescent device comprising:
a pair of electrodes; and
a layer that is disposed between the pair of electrodes and comprises a compound represented by the following formula (1):

Formula (1)

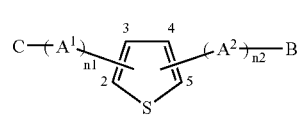

wherein $A^1$ and $A^2$ each independently represent an aromatic ring and may be substituents at any of positions 2, 3, 4 and 5 of the thiophene ring; B represents a substituent having a positive Hammett substituent constant σp; C represents a substituent having a negative Hammett substituent constant σp; n1 and n2 each independently represent 0, 1 or 2, wherein n1 and n2 are not 0 at the same time; and the thiophene ring may have a substituent selected from the group consisting of an alkyl group having 1 to 8 carbon atoms, an alkoxy group and a halogen atom.

2. The organic electroluminescent device of claim 1, wherein the compound represented by formula (1) is a compound represented by the following formula (2):

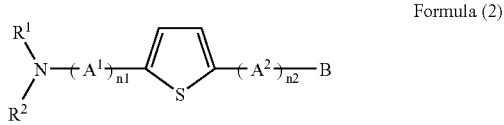

Formula (2)

wherein $A^1$ and $A^2$ each independently represent an aromatic ring;

B represents a substituent having a positive Hammett substituent constant σp; $R^1$ and $R^2$ each independently represent an alkyl group; n1 and n2 each independently represent 0, 1 or 2, wherein n1 and n2 are not 0 at the same time; and the thiophene ring may have a substituent selected from the group consisting of an alkyl group having 1 to 8 carbon atoms, an alkoxy group and a halogen atom.

3. The organic electroluminescent device of claim 1, wherein the compound represented by formula (1) exhibits liquid crystallinity.

4. The organic electroluminescent device of claim 2, wherein the compound represented by formula (2) exhibits liquid crystallinity.

5. The organic electroluminescent device of claim 1, further comprising a heater that heats the organic electroluminescent device.

6. The organic electroluminescent device of claim 2, further comprising a heater that heats the organic electroluminescent device.

7. The organic electroluminescent device of claim 3, further comprising a heater that heats the organic electroluminescent device.

8. The organic electroluminescent device of claim 4, further comprising a heater that heats the organic electroluminescent device.

9. The organic electroluminescent device of claim 1, wherein either one of $A^1$ and $A^2$ is an aromatic ring having 5 to 10 carbon atoms.

10. The organic electroluminescent device of claim 1, wherein either one of $A^1$ and $A^2$ is one selected from the group consisting of 1,4-phenylene, thiophene-2,5-diyl, 2,6-naphthalene, thiazole-2,5-diyl, pyridine-2,3-diyl, benzofuran-2,5-diyl, benzofuran-2,6-diyl, benzothiophene-2,5-diyl, benzothiophene-2,6-diyl, pyrimidine-2,5-diyl, pyrazine-2,5-diyl and pyridazine-3,6-diyl.

11. The organic electroluminescent device of claim 1, wherein $A^1$ is a substituent at position 2 or 5 of the thiophene ring, and $A^2$ is a substituent at position 5 or 2 of the thiophene ring.

12. The organic electroluminescent device of claim 1, wherein C represents a substituted amino group or an alkoxy group.

13. The organic electroluminescent device of claim 1, wherein B represents one selected from the group consisting of an ester group (—COOR$^3$), a sulfonyl group (—SO$_2$R$^3$), a sulfoxy group (—SO$_3$R$^3$), and the following substituents:

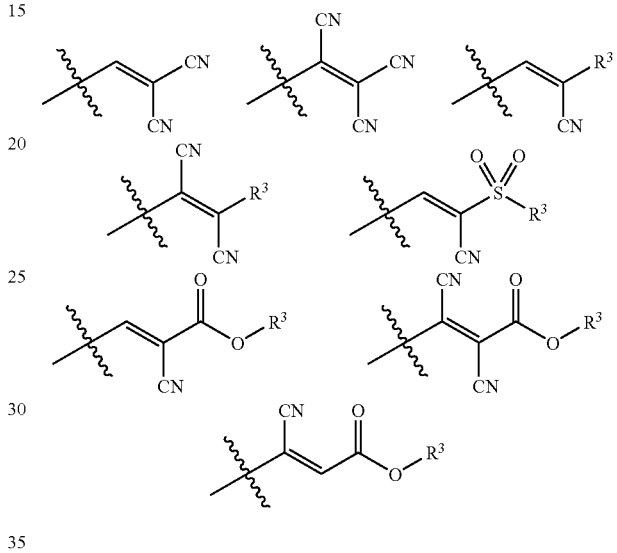

wherein $R^3$ represents an alkyl group having 1 to 16 carbon atoms.

14. The organic electroluminescent device of claim 2, wherein $R^1$ and $R^2$ are each independently a straight-chain alkyl group.

15. The organic electroluminescent device of claim 2, wherein $R^1$ and $R^2$ are each independently a straight-chain alkyl group having 1 to 6 carbon atoms.

16. The organic electroluminescent device of claim 3, wherein the compound represented by formula (1) exhibits a smectic or nematic phase.

17. The organic electroluminescent device of claim 4, wherein the compound represented by formula (2) exhibits a smectic or nematic phase.

18. The organic electroluminescent device of claim 1, further comprising a hole-transporting layer and an electron-transporting layer.

* * * * *